United States Patent
Lombardi et al.

(10) Patent No.: US 9,531,345 B2
(45) Date of Patent: Dec. 27, 2016

(54) ANTENNA TUNING IN A MODULAR PORTABLE COMMUNICATION DEVICE

(71) Applicant: Motorola Mobility LLC, Chicago, IL (US)

(72) Inventors: Michael J Lombardi, Lake Zurich, IL (US); Mohammed Abdul-Gaffoor, Palatine, IL (US); Paul Fordham, Wauconda, IL (US)

(73) Assignee: Motorola Mobility LLC, Chicago, IL (US)

(*) Notice: Subject to any disclaimer, the term of this patent is extended or adjusted under 35 U.S.C. 154(b) by 0 days.

(21) Appl. No.: 14/625,682

(22) Filed: Feb. 19, 2015

(65) Prior Publication Data
US 2016/0248401 A1 Aug. 25, 2016

(51) Int. Cl.
| | |
|---|---|
| H04M 1/00 | (2006.01) |
| H04B 1/38 | (2015.01) |
| H03J 1/00 | (2006.01) |
| H04M 1/02 | (2006.01) |
| H01Q 1/24 | (2006.01) |
| H03J 1/16 | (2006.01) |
| H03J 7/04 | (2006.01) |

(52) U.S. Cl.
CPC .......... *H03J 1/0083* (2013.01); *H01Q 1/243* (2013.01); *H03J 1/16* (2013.01); *H03J 7/047* (2013.01); *H04M 1/0254* (2013.01)

(58) Field of Classification Search
None
See application file for complete search history.

(56) References Cited

U.S. PATENT DOCUMENTS

| | | | | | |
|---|---|---|---|---|---|
| 7,920,646 | B2* | 4/2011 | Yeh | .............. | H04B 7/0695 375/299 |
| 8,136,735 | B2* | 3/2012 | Arai | .............. | G06K 19/07718 235/487 |
| 8,444,054 | B2* | 5/2013 | Kazama | ............ | G06K 17/0022 235/439 |
| 8,627,075 | B2* | 1/2014 | Ikeda | .............. | H04B 5/02 455/41.1 |
| 2006/0158317 | A1* | 7/2006 | Kuriki | .............. | G06K 7/0008 340/10.52 |
| 2007/0138277 | A1* | 6/2007 | Kazama | ............ | G06K 17/0022 235/439 |
| 2010/0103835 | A1* | 4/2010 | Sung | .............. | H04L 5/0037 370/252 |

(Continued)

OTHER PUBLICATIONS

Michael J. Lombardi, et al., "Remote Imaging in Modular Cellular Phone", U.S. Appl. No. 14/663,521, filed Mar. 20, 2015.

(Continued)

*Primary Examiner* — Tuan A Tran
(74) *Attorney, Agent, or Firm* — Miller, Matthias & Hull LLP

(57) ABSTRACT

A system and method of tuning an antenna of a portable device in a modular device system using a device ID associated with second device to tune one or more antennas of a first device. In an embodiment, the first device resolves the device ID of the second device to a set of tuning parameters which improve tuning of the antenna of the first device in the presence of the second device. In a further embodiment, the first device may also tune an antenna of the second device to improve its performance in the presence of the first device.

16 Claims, 7 Drawing Sheets

(56) References Cited

U.S. PATENT DOCUMENTS

2014/0204841 A1* 7/2014 Ruiz Delgado ...... H04B 7/0689
    370/328

OTHER PUBLICATIONS

Michael J. Lombardi, et al., "WIFI Connectivity in a Modular Portable Cellular Device", U.S. Appl. No. 14/663,716, filed Mar. 20, 2015.
Michael J. Lombardi, et al., "Voice Call Management in a Modular Smartphone", U.S. Appl. No. 14/688,361, filed Apr. 6, 2015.
Michael J. Lombardi, et al., "Adaptive Audio in Modular Portable Electronic Device", U.S. Appl. No. 14/737,990, filed Jun. 12, 2015.

* cited by examiner

ANTENNA TUNING IN A MODULAR PORTABLE COMMUNICATION DEVICE

TECHNICAL FIELD

The present disclosure is related generally to mobile device configuration, and, more particularly, to a system and method of antenna tuning with respect to a modular portable communication device.

BACKGROUND

Portable communications devices such as high functionality (multi-function) cellular phones have become important tools for business as well as entertainment and pleasure. However, the more useful such a device becomes, the more likely the user is to carry the device. With this in mind, there is substantial interest in reducing the weight and thickness of such devices even as their capabilities continue to increase.

Component miniaturization and spatial efficiencies will continue to play important roles in this regard. In addition, device customization may be used to reduce the device footprint. For example, a user may wish to have a camera function but not a wireless speaker function; a device that has the former and lacks the latter can be provided, and will have a lower weight and thickness than a device having both features.

However, it is generally not practical for device manufacturers to maintain a large number of different production lines to supply differently-configured versions of the same base device. One approach that allows users to customize a completed device is a modular approach. With modularization, a base or primary device is produced and configured to be compatible with a number of secondary modules or devices that provide additional functions.

Thus, continuing with the example above, the primary device may include basic computing functionality and wireless communication capabilities, but may not include a camera function or a wireless speaker function. To serve the needs of various users, two secondary devices can be produced; the first secondary device may be a camera module and the second secondary device may be a wireless speaker module. By using the primary device coupled to the appropriate secondary module, each user is able to create a device that is customized to meet their needs.

However, with respect to modular platforms such as this, the inventors have observed that different secondary modules may impinge on the antenna performance of the primary device, and may do so in different ways. In particular, if the antenna performance of the first device has been optimized for stand-alone performance, the effect of adding the second device will generally be to decrease the communication performance in the combined unit to some extent.

While the present disclosure is directed to a system that can eliminate certain shortcomings noted in this Background section, it should be appreciated that such a benefit is neither a limitation on the scope of the disclosed principles nor of the attached claims, except to the extent expressly noted in the claims. Additionally, the discussion of technology in this Background section is reflective of the inventors' own observations, considerations, and thoughts, and is in no way intended to accurately catalog or comprehensively summarize the art in the public domain. As such, the inventors expressly disclaim this section as admitted or assumed prior art with respect to the discussed details. Moreover, the identification herein of a desirable course of action reflects the inventors' own observations and ideas, and should not be assumed to indicate an art-recognized desirability.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

DETAILED DESCRIPTION

Figure 1:
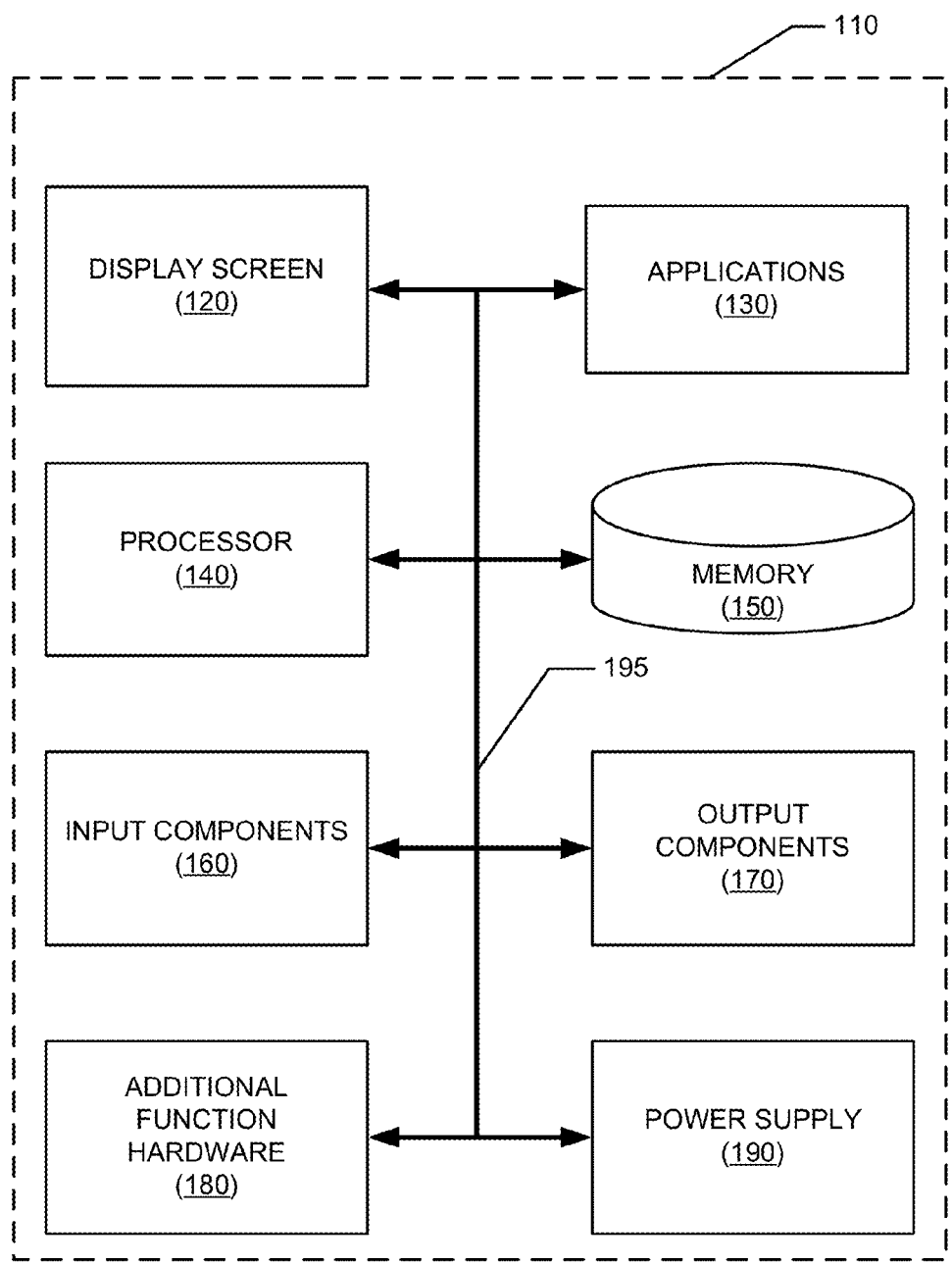
FIG. 1 is a simplified schematic of an example device with respect to which embodiments of the presently disclosed principles may be implemented.

Before presenting a full discussion of the disclosed principles, an overview of certain embodiments is given to aid the reader in understanding the later discussion. As noted above, in the modular device design described herein, there is a first module (the first device) and a second module (e.g., an additional function second device). The first device may contain, for example, a display, a battery, and a number of antennas such as a cellular main antenna, a cellular diversity antenna, a WiFi antenna, a GPS antenna, and a short range wireless antenna.

Although the first device may be referred to herein as the primary device, there may nonetheless be certain variations of the first device. For example, there may be updated versions, different price point versions and so on. However, the second device may be any one of a number of different add-on modules providing different additional functionality or features. For example, the second device may provide any one of, or any combination of, a camera, a speaker, a vibrator, a battery, an audio jack, and other features.

However, as noted above, the addition of each second device to the first device can affect the antenna performance of the first device in a different way. Moreover, while the impact will vary depending upon the type of second device added, the impact will in most cases tend to decrease antenna performance. This decrease in antenna performance will tend to degrade the communication performance of the combined unit.

As noted above, the first device may include a number of antennas, and in an embodiment, these antennas are tuned to perform well in the absence of the second device. In addition, one or more of the antennas is tunable via a tuner located in the RF signal path to the antenna. The tuner allows the associated antenna performance to be dynamically altered.

In this embodiment, when a second device is connected to the first device, the first device determines an identity of the second device and provides an initial parameter setting for one or more antenna tuners to allow the first device's antennas to perform better in the presence of the second device than they would if the tuning was not altered. In a further embodiment, the initial parameter settings for each second device are provided via a table or array indexed by device identity or type.

With this overview in mind, and turning now to a more detailed discussion in conjunction with the attached figures, the techniques of the present disclosure are illustrated as being implemented in a suitable computing environment. The following device description is based on embodiments and examples of the disclosed principles and should not be taken as limiting the claims with regard to alternative embodiments that are not explicitly described herein. Thus, for example, while FIG. 1 illustrates an example mobile device within which embodiments of the disclosed principles may be implemented, it will be appreciated that other device types may be used, including but not limited to personal computers, tablet computers and other devices.

The schematic diagram of FIG. 1 shows an exemplary component group 110 forming part of an environment within which aspects of the present disclosure may be implemented. In particular, the component group 110 includes exemplary components that may be employed in a device corresponding to the first device and/or the second device. It will be appreciated that additional or alternative components may be used in a given implementation depending upon user preference, component availability, price point, and other considerations.

In the illustrated embodiment, the components 110 include a display screen 120, applications (e.g., programs) 130, a processor 140, a memory 150, one or more input components 160 such as speech and text input facilities, and one or more output components 170 such as text and audible output facilities, e.g., one or more speakers.

The processor 140 may be any of a microprocessor, microcomputer, application-specific integrated circuit, or the like. For example, the processor 140 can be implemented by one or more microprocessors or controllers from any desired family or manufacturer. Similarly, the memory 150 may reside on the same integrated circuit as the processor 140. Additionally or alternatively, the memory 150 may be accessed via a network, e.g., via cloud-based storage. The memory 150 may include a random access memory (i.e., Synchronous Dynamic Random Access Memory (SDRAM), Dynamic Random Access Memory (DRAM), RAMBUS Dynamic Random Access Memory (RDRM) or any other type of random access memory device). Additionally or alternatively, the memory 150 may include a read only memory (i.e., a hard drive, flash memory or any other desired type of memory device).

The information that is stored by the memory 150 can include program code associated with one or more operating systems or applications as well as informational data, e.g., program parameters, process data, etc. The operating system and applications are typically implemented via executable instructions stored in a non-transitory computer readable medium (e.g., memory 150) to control basic functions of the electronic device. Such functions may include, for example, interaction among various internal components and storage and retrieval of applications and data to and from the memory 150.

Further with respect to the applications 130, these typically utilize the operating system to provide more specific functionality, such as file system service and handling of protected and unprotected data stored in the memory 150. Although many applications may provide standard or required functionality of the user device 110, in other cases applications provide optional or specialized functionality, and may be supplied by third party vendors or the device manufacturer.

Finally, with respect to informational data, e.g., program parameters and process data, this non-executable information can be referenced, manipulated, or written by the operating system or an application. Such informational data can include, for example, data that are preprogrammed into the device during manufacture, data that are created by the device or added by the user, or any of a variety of types of information that are uploaded to, downloaded from, or otherwise accessed at servers or other devices with which the device is in communication during its ongoing operation.

The device having component group 110 may include software and hardware networking components 180 to allow communications to and from the device. Such networking components 180 will typically provide wireless networking functionality, although wired networking may additionally or alternatively be supported.

In an embodiment, a power supply 190, such as a battery or fuel cell, may be included for providing power to the device and its components 110. All or some of the internal components 110 communicate with one another by way of one or more shared or dedicated internal communication links 195, such as an internal bus.

In an embodiment, the device 110 is programmed such that the processor 140 and memory 150 interact with the other components of the device 110 to perform certain functions. The processor 140 may include or implement various modules and execute programs for initiating different activities such as launching an application, transferring data, and toggling through various graphical user interface objects (e.g., toggling through various display icons that are linked to executable applications).

Figure 2:
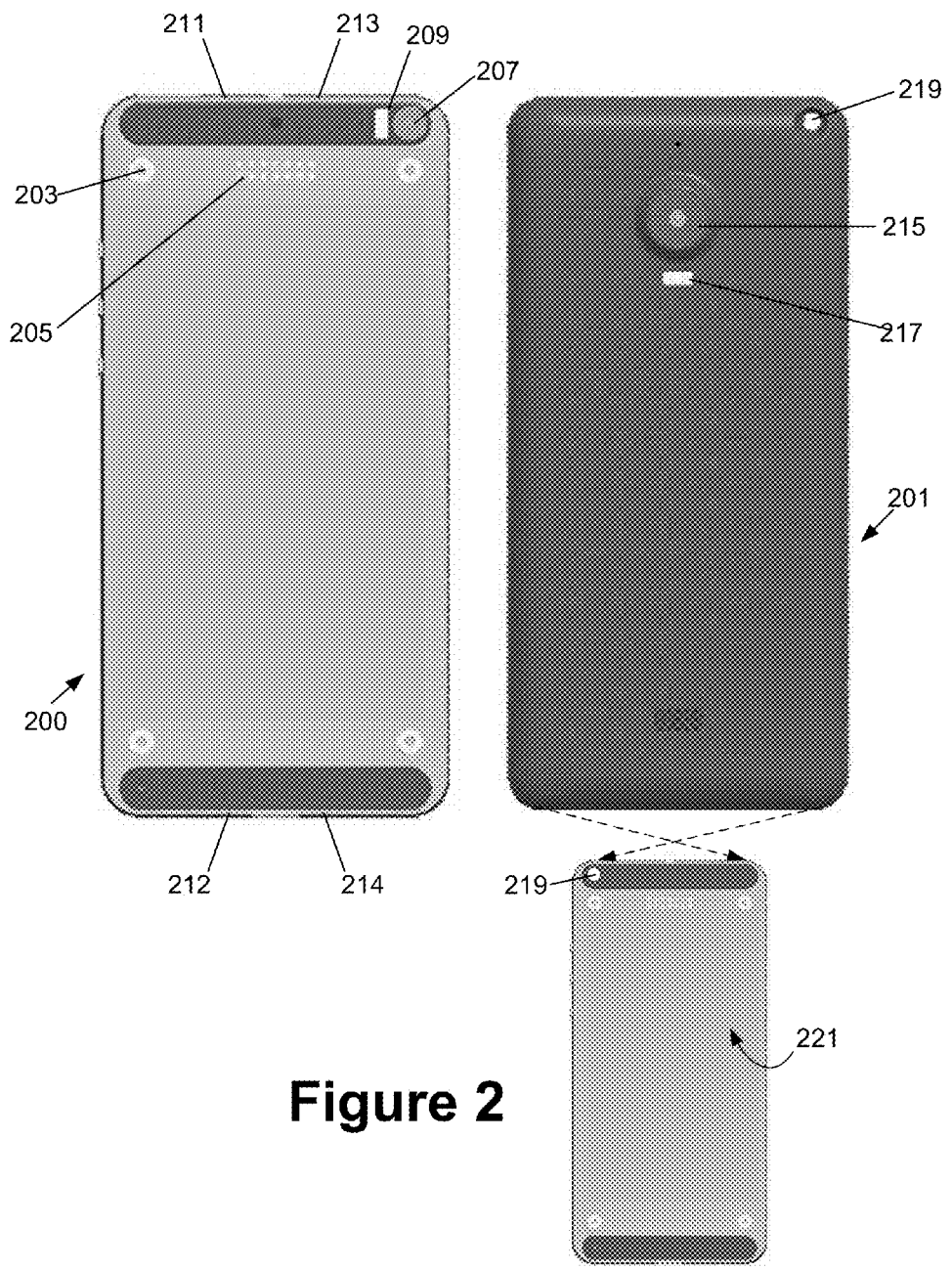
FIG. 2 is plan view of a first device and a second device, showing the back of the first device and the back of the second device in accordance with an embodiment of the disclosed principles.

Turning to FIG. 2, this figure presents a view of a first device and a second device, showing the back of the first device and the back of the second device in accordance with an embodiment of the disclosed principles. In the illustrated example, the back of the first device 200 includes one or more alignment features 203 configured and placed to mate with mating features on the front 221 of the second device 201.

In addition, the back of the first device 200 in the illustrated embodiment includes a connector array 205. The connector array 205 is located and configured to mate with a mating connector array on the front 221 of the second device 201. The top of the first device 200 includes a first antenna 211 and a second antenna 213 and the bottom of the first device 200 includes a third antenna 212 and a fourth antenna 214. It is these antennas whose performance may be affected when the first device and second device are mated.

In the illustrated embodiment, the back of the first device 200 further includes a built-in camera 207 and an associated flash 209. It will be appreciated that the first device 200 may include different features or additional features as compared to the illustrated embodiment.

In the illustrated example, the second device 201 provides at least an enhanced camera function. To this end, the second device 201 includes on its rear face a camera 215 and an associated flash 217. Further, in the illustrated example, use of the camera 215 of the second device 201 does not preclude the use of the camera 207 of the first device 200. As such, a hole 219 is provided in the second device 201 to allow a sight line for the camera 207 of the first device 200.

Figure 3:
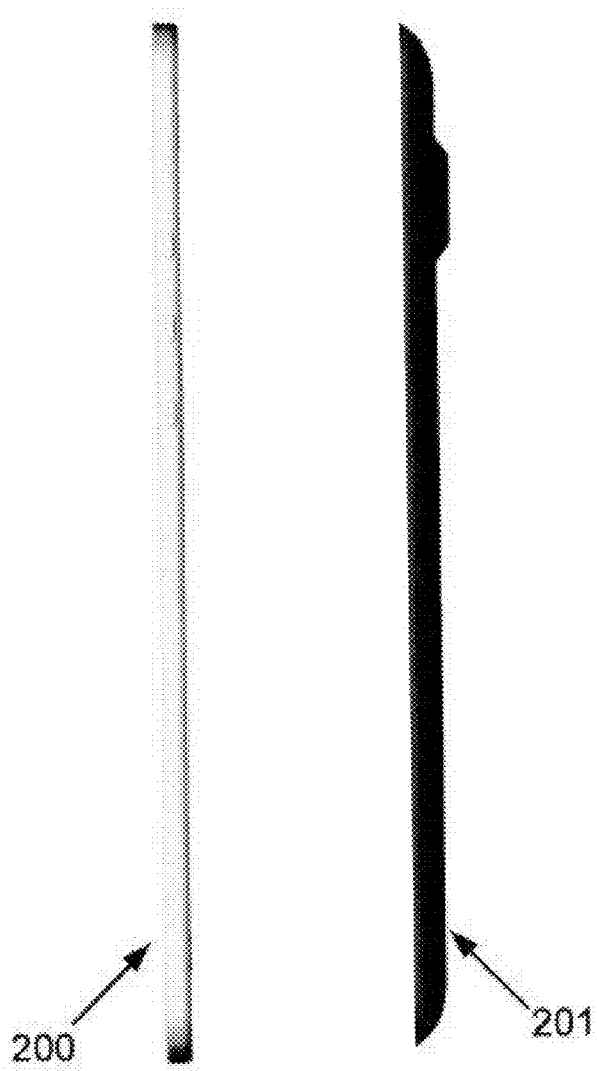
FIG. 3 is side view of the first device and the first device mated with the second device in accordance with an embodiment of the disclosed principles.
Figure 4:
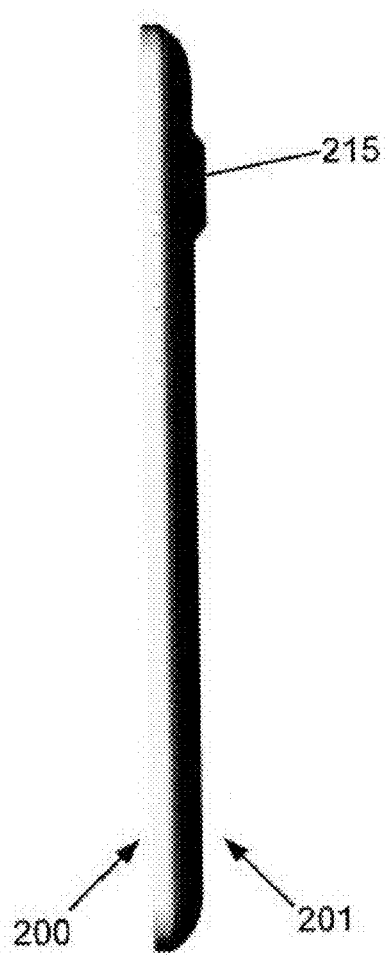
FIG. 4 is side view of the first device and the second device mated together via the back of the first device and the front of the second device in accordance with an embodiment of the disclosed principles.

FIG. 3 is a side view of the first device 200 and the second device 201, not yet mated together. Continuing, FIG. 4 is a side view of the first device 200 and the second device 201 mated together at the back of the first device 200 and the front of the second device 201 in accordance with an embodiment of the disclosed principles. As can be seen, the devices 200, 201 are in physical contact when mated. In should be noted that different embodiments of the second device 201 may vary significantly in thickness and shape from one another.

When the devices are mated together as shown in FIG. 4, the second device 201 is in physical proximity to, and may even overlap, the antennas 211, 212, 213, 214 of the first device 200. In some embodiments, the overlap of the antennas 211, 212, 213, 214 is caused by plastic on the second device 201, and in other embodiments of the second device 201, the overlap may be caused by functional components such as audio jacks. In addition, the second device 201 may contain antennas of its own adjacent to the antennas of the first device 200.

When the second device 201 is attached to the first device 200, the first device 200 reads a device ID from, or associated with, the second device 201. Based on the device ID, the first device 200 dynamically alters one or more antenna tuners to optimize the associated antenna's performance during the time that the second device 201 remains attached to the first device 200.

Figure 5:
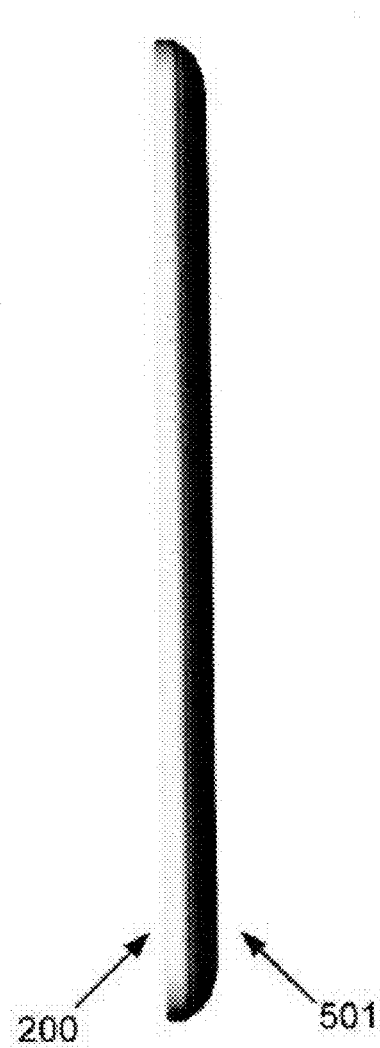
FIG. 5 is side view of the first device and a third device mated together via the back of the first device and the front of the third device in accordance with an embodiment of the disclosed principles.

FIG. 5 shows the first device 200 mated to an alternative second device 501, also referred to herein as a third device. The third device 501 is similar to the second device 201 but lacks a camera. The third device 501 may also incorporate one or more other features not found on the second device 201.

Figure 6:
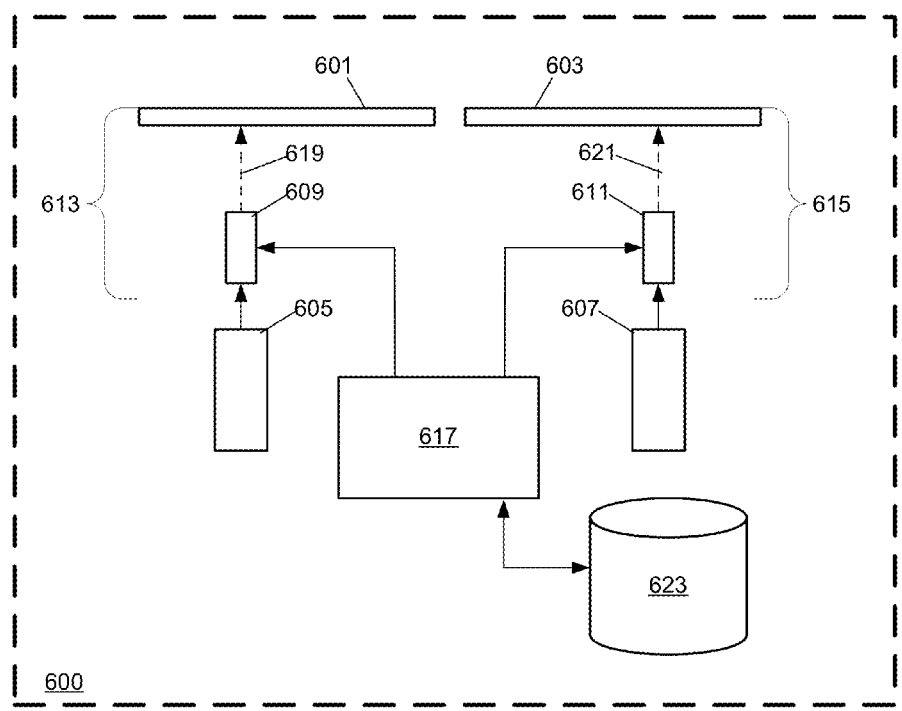
FIG. 6 is a circuit schematic showing relative electrical relationships between system components in accordance with an embodiment of the disclosed principles.

Before discussing the process for executing antenna tuning, a schematic illustration of the topology of the first device 200 is given to assist in understanding the process. In this regard, the schematic drawing of FIG. 6 illustrates the salient aspects of an antenna tuning circuit 600 in keeping with an embodiment of the disclosed principles.

The illustrated circuit 600 includes a first antenna 601 (e.g., antenna 211 of FIG. 2) and a second antenna 603 (213). Each antenna 601, 603 is linked to a respective RF transceiver 605, 607, which generates an electrical signal containing information imposed on a carrier wave of an appropriate frequency for the antenna 601, 603. The frequencies for the two antennas 601, 603 may be the same or different, e.g., the first antenna 601 may be a cellular antenna and the second antenna 603 may be a WiFi antenna.

A respective tuner 609, 611 lies between each RF transceiver 605, 607 and its associated antenna 601, 603. Each tuner 609, 611 includes a variable element that affects the capacitance or inductance of the circuit portion 613, 615 that includes the antenna and tuner. A controller 617, which may be the same as, or implemented by, the device processor 140, is linked to each tuner 609, 611. The respective links 619, 621 between the tuners 609, 611 and the antennas 601, 603 may be either direct links, e.g., traces or wires, or indirect links, e.g., capacitive coupling.

In operation, the controller 617 detects the attachment of the second device, e.g., device 201, to the first device 200, and reads a device ID from the second device 201. The device ID identifies or can be used to identify a type of the second device 201 with respect to its effect on the performance of the antennas of the first device 200. For example, if the second device 201 and the third device 601 have the same effect on the antenna performance of the first device 201, then both the second and third devices 201, 601 may be of the same type and have the same ID.

The controller 617 accesses a memory 623, either locally or remotely, to resolve the obtained device ID to a set of one or more tuning parameters. For example, the controller 617 may access a tabular data set linking device types to tuning parameter sets. Once the controller 617 obtains a tuning parameter set associated with the added device, the controller 617 sets each tuner 609, 611 as specified in the set of one or more tuning parameters. While the tuning parameter sets are constructed to maximize antenna performance on the first device 200, it may still be appropriate to slightly retune the tuners 609, 611 from the specifications of the tuning parameter set depending on ambient conditions.

Although the illustrated circuit of FIG. 6 is given in the context of the illustrated first device 200, it will be appreciated that any device 200, 201, 501 that is configured to mate to another may include such a circuit in the event that the device is a wireless communication device.

Figure 7:
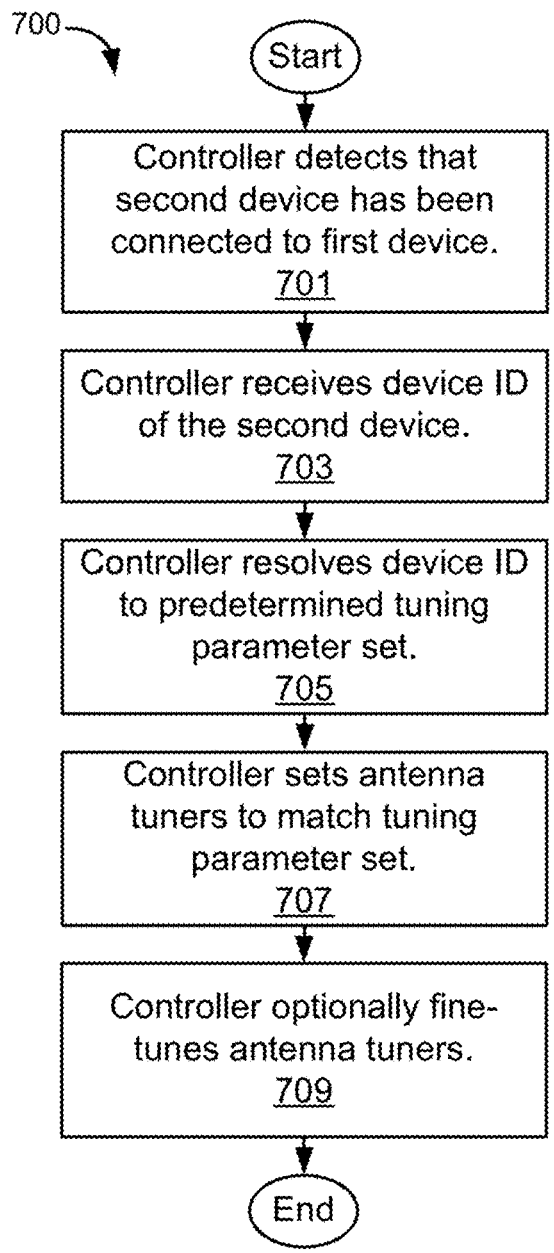
FIG. 7 is a flow chart showing an example process of antenna tuning in accordance with an embodiment of the disclosed principles.

Bearing in mind the foregoing overview of an embodiment of the antenna tuning architecture, FIG. 7 depicts an exemplary process 700 for antenna tuning in a modular portable device. At stage 701 of the process 700, the controller 617 of the first device 200 detects that a second device, for example device 201, has been connected to the first device 200. This detection may be made, for example, by detecting the connection of the mating contacts on the two devices 200, 201.

At stage 703 of the process 700, the controller 617 receives a device ID of the connected device 201, e.g., via the mating contacts of the devices 200, 201. The received device ID is resolved to a predetermined set of tuning parameters associated with the device 200 at stage 705. In an embodiment, the controller 617 resolves the received ID to the predetermined set of tuning parameters by referencing a table or array stored in local or remote memory. In an embodiment, the device ID itself contains the predetermined parameters.

Given the device-specific tuning parameters, the controller 617 sets the antenna circuit tuners, e.g., the tuners 609 and 611, at stage 707 to match the settings specified by the of tuning parameters. While the device-specific tuning parameters are configured to at least approximate an optimal tuning of the antennas 601, 603 of the first device 200 in the presence of the second device 201, other factors such as RF noise and temperature may render the device-specific tuning parameters not quite optimal. For this reason, the controller 617 optionally fine-tunes the antenna circuit tuners at stage 709 of the process 700 to achieve the best attainable antenna performance.

In an embodiment, the attached device, e.g., device 201, also includes an antenna and an antenna tuner. In this embodiment, the controller 617 is configured to adjust the tuning on both device 200, 201. In an alternative embodiment, each device performs tuning of its own antenna or antennas using a predetermined set of parameters that are based on the other device type.

It will be appreciated that a system and method for antenna tuning in a modular portable device has been disclosed herein. However, in view of the many possible embodiments to which the principles of the present disclosure may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

We claim:

1. A portable electronic device, the portable electronic device comprising:
   a battery, a memory, a display and an interconnect array to electrically connect the portable electronic device to a second device via physical attachment;
   a cellular antenna and a WiFi antenna configured to transmit and receive radio frequency (RF) signals;
   at least one radio frequency (RF) transceiver configured to send an outgoing RF signal to the cellular antenna and the WiFi antenna and to process an incoming RF signal from the cellular antenna or the WiFi antenna;
   at least one RF tuner connecting the at least one RF transceiver to the cellular antenna and the WiFi antenna; and
   a controller configured to detect attachment of the second device to the portable electronic device, detect an ID associated with the second device, resolve the detected ID to a set of RF tuning parameters and to configure the at least one RF tuner in accordance with the set of RF tuning parameters for the cellular antenna and the WiFi antenna.

2. The portable electronic device in accordance with claim 1, wherein the controller is further configured to adjust the at least one RF tuner after configuring the at least one RF tuner in accordance with the set of RF tuning parameters.

3. The portable electronic device in accordance with claim 1, wherein the ID associated with the second device identifies a model of the device.

4. The portable electronic device in accordance with claim 1, wherein the controller is further configured to allow tuning of the at least one RF tuner by the second device.

5. The portable electronic device in accordance with claim 4, wherein the controller is further configured to convey to the second device a device ID corresponding to the first device.

6. The portable electronic device in accordance with claim 1, wherein at least one antenna of the first device is at least partly obscured by the second device when the second device is mated to the portable electronic device.

7. The portable electronic device in accordance with claim 1, wherein the controller is further configured to detect disconnection of the second device from the first device and, in response, to modify the configuration of the at least one RF tuner.

8. The portable electronic device in accordance with claim 1, wherein the controller is further configured to configure a tuner associated with an antenna of the second device based on the ID associated with the second device.

9. A method of tuning at least two antennas of a portable electronic device when a second device is physically attached to the portable electronic device, the at least two antennas having at least one associated tuner and including a cellular antenna and a WiFi antenna, the method comprising:
   detecting physical attachment of the second device to the portable electronic device;
   detecting an ID associated with the second device;
   resolving the detected ID to a set of RF tuning parameters; and
   configuring the at least one RF tuner in accordance with the set of RF tuning parameters to configure both the cellular antenna and the WiFi antenna.

10. The method in accordance with claim 9, further comprising adjusting the at least one RF tuner after configuring the at least one RF tuner in accordance with the set of RF tuning parameters.

11. The method in accordance with claim 9, wherein the ID associated with the second device identifies a model of the device.

12. The method in accordance with claim 9, further comprising allowing configuration of the at least one RF tuner by the second device.

13. The method in accordance with claim 12, further comprising conveying to the second device a device ID corresponding to the first device.

14. The method in accordance with claim 9, further comprising detecting disconnection of the second device from the first device and, in response, modifying the configuration of the at least one RF tuner.

15. The method in accordance with claim 9, further comprising configuring a tuner associated with an antenna of the second device based on the ID associated with the second device.

16. A modular portable device system comprising a first portable electronic device and a second portable electronic device, wherein the first portable device includes an interconnect array to electrically connect the first portable electronic device to a second portable electronic device when the second portable electronic device is physically attached to the first portable electronic device, a cellular antenna and a WiFi antenna, a radio frequency (RF) transceiver, an RF tuner connecting the at least one RF transceiver to the cellular antenna and the WiFi antenna, and a controller configured to detect physical attachment of the second portable electronic device to the first portable electronic device, detect an ID associated with the second device, resolve the detected ID to a set of RF tuning parameters and to configure the at least one RF tuner in accordance with the set of RF tuning parameters to configure both the cellular antenna and the WiFi antenna.

* * * * *